(12) United States Patent
Curran et al.

(10) Patent No.: US 6,657,471 B1
(45) Date of Patent: Dec. 2, 2003

(54) HIGH PERFORMANCE, LOW POWER DIFFERENTIAL LATCH

(75) Inventors: Brian W. Curran, Saugerties, NY (US); Edward T. Malley, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/290,649

(22) Filed: Nov. 8, 2002

(51) Int. Cl.[7] .................... G11C 7/06; H03K 3/356
(52) U.S. Cl. .................... 327/211; 327/212; 327/55
(58) Field of Search .................. 327/55, 57, 51–54, 327/56, 211, 212, 208–210, 214, 199

(56) References Cited

U.S. PATENT DOCUMENTS

| | | | | |
|---|---|---|---|---|
| 6,344,761 B2 | * | 2/2002 | Nishimura et al. | 327/57 |
| 6,373,782 B1 | * | 4/2002 | Ikeda | 327/55 |
| 6,396,309 B1 | * | 5/2002 | Zhao et al. | 327/57 |
| 6,498,516 B2 | * | 12/2002 | Yau | 327/55 |

* cited by examiner

Primary Examiner—Toan Tran
(74) Attorney, Agent, or Firm—Lynn L. Augspurger

(57) ABSTRACT

An improved pull-down latch circuit is provided for better latch performance. Previous pull-down latch circuit performance is compromised during pull-up operation since weak PFETs are employed to pull up latch nodes. A pull up assist circuit is incorporated to assist weak PFET when latch node is being pulled up. The assist circuit is isolated from latch circuit when latch node is being pull down to guarantee that pull down circuit can overcome pull-up circuit (for correct latch operation).

7 Claims, 2 Drawing Sheets

HIGH PERFORMANCE, LOW POWER DIFFERENTIAL LATCH

FIELD OF THE INVENTION

This invention relates to local clock distribution and low power circuit design

1. Trademarks

IBM® is a registered trademark of International Business Machines Corporation, Armonk, N.Y., U.S.A. Other names may be registered trademarks or product names of International Business Machines Corporation or other companies.

2. Background

In modern microprocessors, an important new design obstacle has begun to emerge. Now, instead of a designer spending most of his time maximizing the speed of his logic, power consumption must be considered a more critical parameter. Recent studies have shown that the primary problem with power distribution lies in the clock, more specifically, the local clock and latch power, and with feature sizes decreasing and scale of integration increasing, this problem will continue to worsen. Thus, it can be concluded that improvements in clock distribution techniques, especially local clock distribution, and latch design, have the potential to lead to major power savings overall.

SUMMARY OF THE INVENTION

Many prior-art latch designs employ a simple complementary pull down network to write data into the latch. Unfortunately, due to the small transistor sizes, these designs can be, slow compared to the pass gate based latch designs. While it would be possible to improve the performance by increasing transistor size, it is important to consider power when doing so. Since larger transistors mean more power consumption, this solution is unacceptable. Instead, an additional small logic structure can be added to the latch to increase the performance of the typically slow pull-up of the complementary latch with a minimal increase in power consumption. Additional improvements also make it possible to save much of the clock power dissipated in driving these latches.

These and other improvements are set forth in the following detailed description. For a better understanding of the invention with advantages and features, refer to the description and to the drawings.

Our detailed description explains the preferred embodiments of our invention, together with advantages and features, by way of example with reference to the drawings.

DETAILED DESCRIPTION OF THE INVENTION

Figure 1:
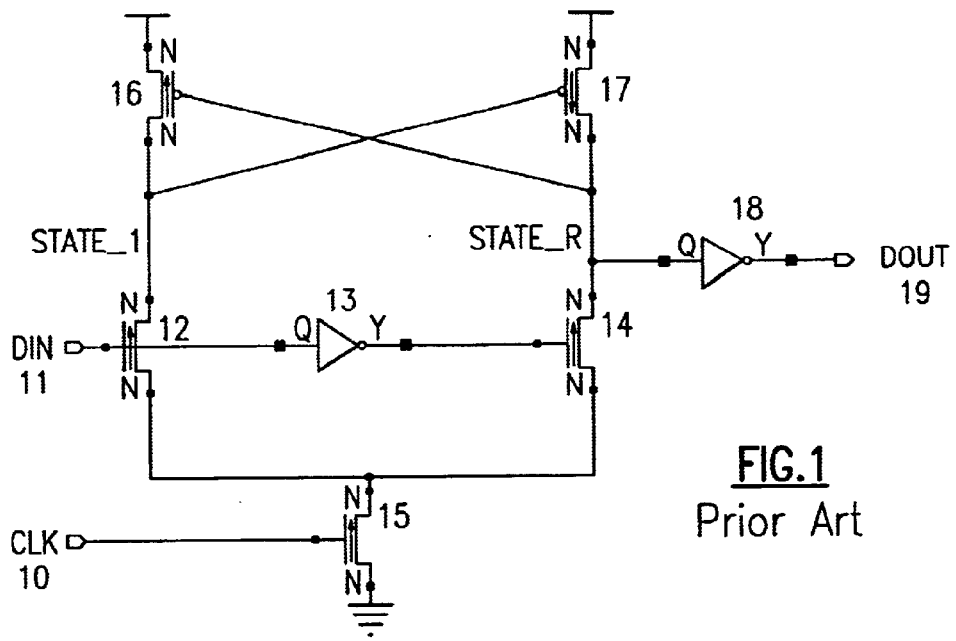
FIG. 1 illustrates a prior art complementary pull down latch.

Referring to FIG. 1, a schematic of the prior-art complementary pull down latch is shown. When clock 10 is high, the latch stores the data din 11 on the node state_r and its complement on node stated_1. If, for example, din 11 is a logical 1 (Vdd potential), the NFET 12 will turn ON and node stated_1 will be pulled down to a logical zero (ground potential.) This will subsequently turn on PFET 17, pulling node state_r up to Vdd potential. Subsequently when clock 10 is pulled low, the pull down network (consisting of NFETs 12, 14 and 15) is disabled and the data on nodes state_1 and state_r are held.

This latch posesses a number of flaws. First, this particular latch design is dynamic. In other words, when clock 10 is low, either PFET 16 or PFET 17 is responsible for keeping either state_1 or state_r at a logical 1, but no device holds state_1 or state_r at a logical 0. As a result, either state_1 or state_r (whichever is supposed to be at 0) could switch due to FET gate leakage, FET source/drain leakage, a charge sharing event (when NFET 12 or NFET 14 turns ON) or an event which capacitively couples charge into nodes stated_1 or stated_r.

Second, in order to ensure a quick pull down, and prevent unnecessary power consumption when the latch is in its steady state, the strengths of PFETs 16 and 17 are made significantly smaller than the strengths of NFETs 12 and 14. This way, the NFET stack will always be strong enough to change the state of nodes stated_1 and starer. Unfortunately, weak PFETs 16 and 17 yield poor performance when they need to pull either state1 or state_r up to a logical 1. As an illustration of this poor performance consider the following sequences of events. Initially nodes din 21, state_1 and state_r are at logical 1, 1 and 0 respectively, and NFET 12 is ON. Next clock 10 switches to a logical 1 turning NFET 15 ON. State_1 is pulled low through NFETs 12 and 15. Subsequently PFET 17 is turned ON, which in turn pulls up node state_r to a logical 1. Recall that PFET 17 is weak however; node state_r is thus pulled up slowly and severely increases the time to propagate a logical 1 from node din 1 to a logical 1 on node state_r.

Figure 2:
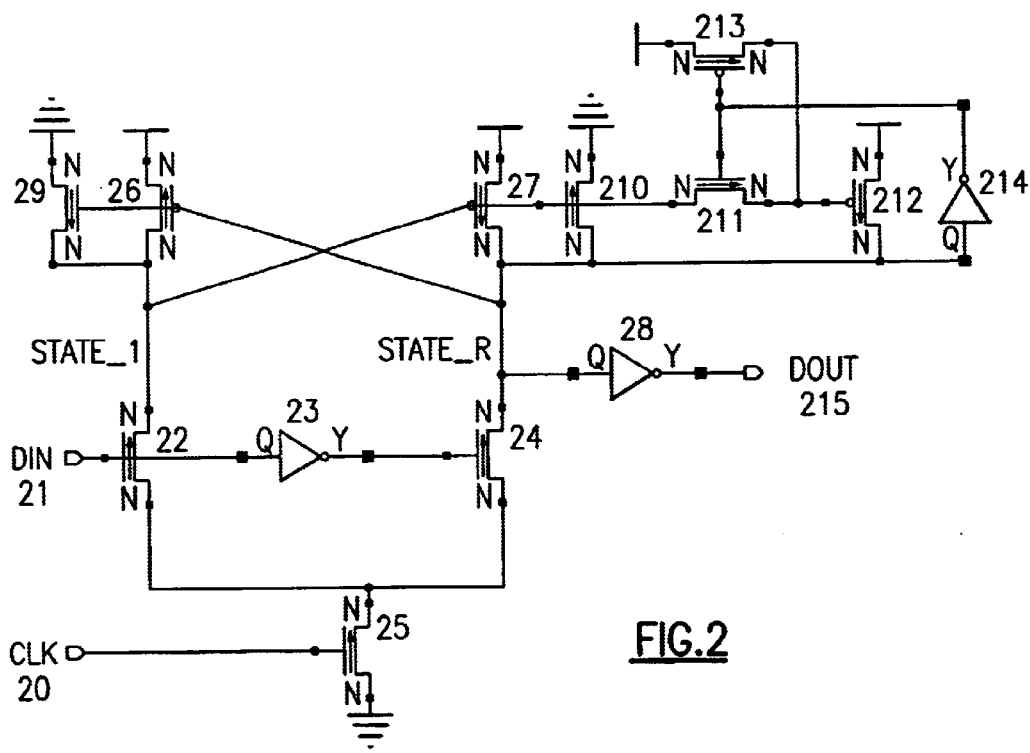
FIG. 2 illustrates the pull-up assisted complementary pull down latch.

Referring to FIG. 2, the first problem is easily fixed. NFET 29 and NFET 210 have been added to the latch design in order to keep the appropriate node at a logical 0 when the latch is not being written. This makes the latch immune to any charge sharing, coupling, or leakage events that could disturb its state. Like PFET 26 and PFET 27, these transistors are small in order to avoid unnecessary power consumption.

The second problem is slightly more difficult. In order to improve latch write performance, a pull-up assist network has been added to the design. Initially nodes din 21, state1 and state_r are at logical 1, 1 and 0 respectively, inverter 214 is driving a 1 onto the gates of PFET 213 and NFET 211, NFET 211 is ON and PFET 213 is OFF. Next clock 20 switches to a logical 1 turning NFET 25 ON. State_1 is pulled low through NFETs 22 and 25. Subsequently PFET 27 and PFET 212 are turned ON, which in turn pulls up node state_r to a logical 1. Recall that PFET 27 is weak; however, PFET 212 is a much stronger device. This significantly reduces the time required to propagate a logical 1 from node din 1 to a logical 1 on node state_r. PFET 212 can be mush stronger than PFET 27 since it is electrically isolated from node state_r whenever is a logical 1 (and must be pulled down.) The electrical isolation works as follows. When node state_r is a logical 1, the output of inverter 214 is a logical 0, NFET 211 is OFF and PFET 213 is ON. The gate of PFET 212 is pulled to a logical 1 and PFET 212 is thus electrically isolated from the rest of the circuit.

Figure 3:
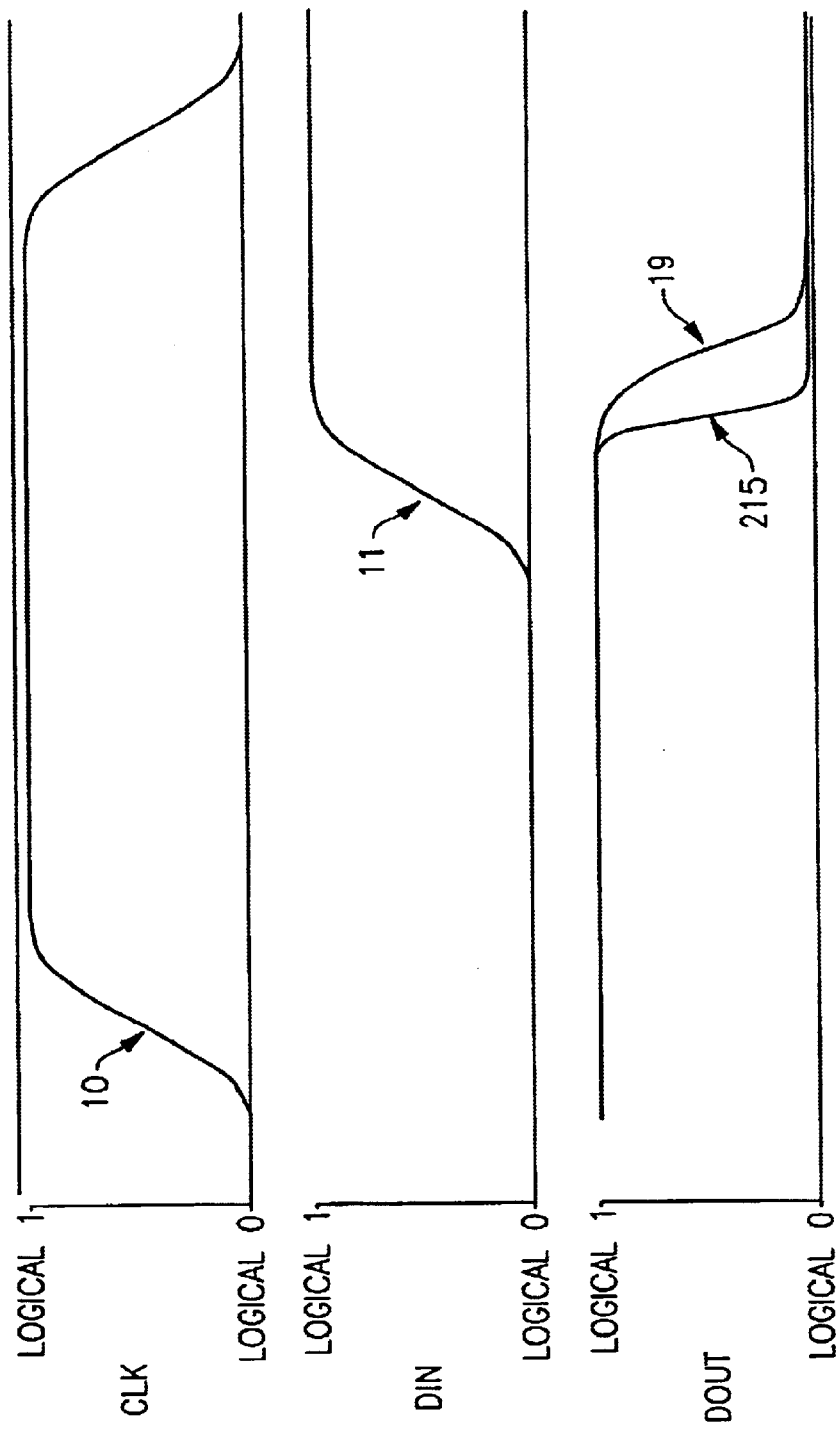
FIG. 3 compares the performance of the prior art and pull-up assisted complementary pull down latches.

FIG. 3 contains wave forms illustrating the latch performance improvement. As can be seen, the output node 215 of the pull-up assisted latch (represented by the dotted line in the graph) evaluates much faster than output node 19 of the prior art latch (represented by the solid line). It should also be noted that this additional hardware results in virtually no increase in overall power consumption of the latch.

It is possible to improve this design even further. Not all applications are timing critical. In these cases, it is acceptable to trade performance for power savings. Local clock power can be reduced by three-fours by a half swing clock 20. (Power is proportional to voltage squared.) When clock 20 is at a logical 0 (ground) NFET 25 is OFF as usual. When clock 20 transitions to Vdd/2, NFET 25 is partially ON. Node state_1 or node state_r are still pulled to ground, but more slowly than when NFET 25 is fully ON.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A latch circuit comprising a clock input, a data input, a latch node, a clocked pull down network, a cross-coupled pull-up network, and a pull-up assist network, wherein said data input and said clock input are coupled to said pull-down network, said pull-down network is coupled to said latch node, said cross-coupled pull-up network and said pull-up assist network.

2. The latch circuit according to claim 1 wherein said clock ed pull-down network comprises a clocked NFET, an inverter, a data NFET, and an inverted data NFET, wherein said clock input is coupled to said clocked NFET, said data input is coupled to said data NFET and said inverter, said inverter is coupled to said inverted data NFET.

3. The latch circuit according to claim 2 wherein said cross-coupled pull-up network comprises a first PFET, and a second PFET, wherein the gate of said first PFET is coupled to the drain of said second PFET and the-gate of said second PFET is coupled to the drain of said first PFET.

4. The latch circuit according to claim 3 wherein said pull-up assist network comprises a pass NFET, a pull-up assist PFET, a second inverter, and a bleeder PFET, wherein said gate of said first PFET is coupled to said pass NFET, said pass NFET is coupled to said pull-up assist PFET, said latch node is coupled to said drain of said first PFET, to drain of said pull-up assist PFET and to said second inverter, said second inverter is coupled to gate of said pass NFET and to gate of said bleeder PFET.

5. The latch circuit according to claim 4 wherein said pull-up assist PFET and said first PFET of said cross-coupled pull-up network operate in conjunction to pull-up said latch node.

6. The latch circuit according to claim 5 wherein said pull-up assist PFET is isolated from said latch node when said latch node is pulled down.

7. The latch circuit according to claim 6 wherein said pull-up assist PFET is isolated from said latch node via said pass NFET.

* * * * *